United States Patent
Shiraishi et al.

(10) Patent No.: US 6,725,322 B1
(45) Date of Patent: Apr. 20, 2004

(54) MEMORY CARD, METHOD FOR ALLOTTING LOGICAL ADDRESS, AND METHOD FOR WRITING DATA

(75) Inventors: Atsushi Shiraishi, Kodaira (JP); Manabu Inoue, Kodaira (JP); Shigemasa Shiota, Tachikawa (JP); Yosuke Yukawa, Kokubunji (JP); Yuichiro Onuki, Shinagawa (JP); Takeshi Suzuki, Inagi (JP); Kenzo Matsumura, Higashiyamato (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 09/913,963
(22) PCT Filed: Feb. 15, 2000
(86) PCT No.: PCT/JP00/00827
§ 371 (c)(1),
(2), (4) Date: Aug. 21, 2000
(87) PCT Pub. No.: WO00/50997
PCT Pub. Date: Aug. 31, 2000

(30) Foreign Application Priority Data

Feb. 22, 1999 (JP) ............................................. 11-042518

(51) Int. Cl.⁷ ........................... G06F 12/00; G06F 12/02
(52) U.S. Cl. ...................... 711/103; 711/170; 711/172; 711/201; 711/202
(58) Field of Search ............................... 711/103, 170, 711/172, 201, 202

(56) References Cited

U.S. PATENT DOCUMENTS

| | | | | |
|---|---|---|---|---|
| 5,598,370 A | * | 1/1997 | Niijima et al. ......... | 365/185.33 |
| 5,630,093 A | * | 5/1997 | Holzhammer et al. ...... | 711/115 |
| 5,799,168 A | | 8/1998 | Ban ........................... | 711/103 |
| 6,459,644 B2 | * | 10/2002 | Mizushima et al. ... | 365/230.01 |

FOREIGN PATENT DOCUMENTS

| | | |
|---|---|---|
| EP | 0 557 736 | 9/1993 |
| JP | 5-27924 | 2/1993 |
| JP | 6-124175 | 5/1994 |
| JP | 10-44527 | 2/1998 |
| JP | 11-53248 | 2/1999 |

OTHER PUBLICATIONS

"Electronic Materials", pp. 22–26 edited by Masashi Ooshima published by a company of Koogyo Chosa Kai on Dec. 1, 1990 (English Translation attached).

* cited by examiner

*Primary Examiner*—Kevin Verbrugge
*Assistant Examiner*—Mehdi Namazi
(74) *Attorney, Agent, or Firm*—Miles & Stockbridge P.C.

(57) ABSTRACT

Blocks and clusters are brought to correspondence thereby to erase blocks of memory area efficiently. A flash memory has its physical addresses partitioned from address 0h sequentially into blocks each having eight sectors. The data area of logical address starts at address 4Dh, which is set to the starting physical address 50h of the block which is close to the top of data area, and the data area is set sequentially to the following physical addresses. The remaining logical addresses 3D7Dh–3D7Fh are brought back to the top of physical address and set to physical addresses 0h–2h. Consequently, clusters (a cluster has 4 k bytes or 2 k bytes) of data sent from a host unit correspond to blocks of physical addresses, enabling block erasure of the flash memory, whereby the number of times of erasing operation at data writing can be reduced significantly.

12 Claims, 11 Drawing Sheets

OPERATION VOLTAGE FOR WRITING/ERASING

MEMORY CARD, METHOD FOR ALLOTTING LOGICAL ADDRESS, AND METHOD FOR WRITING DATA

TECHNICAL FIELD

The present invention relates to a technique of high-speed writing on a memory card, and particularly to a technique which is applied effectively to the allotment of logical address to a flash memory.

BACKGROUND ART

For external memory devices of portable personal computers and multi-functional terminal units, memory cards have prevailed in a short time. In the presence of recent demands of enhanced performance of memory cards, the semiconductor memory included in a memory card is, for example, a flash memory which is electrically erasable and rewritable and can hold a huge amount of data without the need of a battery.

According to the study conducted by the inventors of the present invention, the flash memory used for the memory card has a data write operation in which before data is written to addresses, old data in the addresses is erased. This erasing operation takes place in a unit of sector (e.g., a sector has 512 bytes) or a unit of block (a block has 8 sectors, which have 4 k bytes).

The memory card transacts data with a host unit in a unit of cluster (e.g., a cluster has 4 k bytes or 2 k bytes), and the flash memory reads or writes a cluster of data at a time.

The memory card is rendered the logical address allotment of the flash memory before it is shipped. Specifically, a data area for storing data to be transacted with the host unit is set next to an area for various control information including the master boot record, file allocation table and directories.

The IC card of this kind is described in detail in, for example, publication "Electronic Materials", pp. 22–26, edited by Masashi Ooshima, published by a company of Koogyo Choosa Kai on Dec. 1, 1990, and this publication describes the technical trend of various IC cards.

In regard to the above-mentioned data erasing technique for the memory card, the inventors of the present invention have found the following problems.

Since the logical address allotment is in accord with the order of physical address of the flash memory, logical addresses of clusters and those set to the flash memory are out of accord with each other, which compels the above-mentioned pre-writing data erasure to take place in a unit of sector or in units of sector and block in combination, resulting in an increased number of times of erasing operation and a longer data write time.

The host unit has serial operations of data transfer, erasure and writing by expending time for each operation, which retards the speed-up of data writing to the flash memory.

It is an object of the present invention to provide a method of logical address allotment and a method of data writing on a memory card which are capable of speeding up the data writing based on the matching of blocks and clusters, the efficient erasure of block data, and the efficient data writing.

These and other objects and novel features of the present invention will become apparent from the following description of the specification taken in conjunction with the accompanying drawings.

DISCLOSURE OF THE INVENTION

The present invention is designed to use an offset storage section which stores an offset value and an offset calculation section which implements a computation for the offset value in the offset storing section and input logical addresses, and sets the logical addresses which are render the offset based on the calculation by the offset calculation section to physical addresses of the nonvolatile memory so that a unit of block and a unit of cluster match with each other.

The present invention is designed to have the abovementioned offset storage section included in an area of the nonvolatile memory.

The present invention is designed to store the offset value in the ID area of the nonvolatile memory.

The present invention is designed to form sector blocks each including physical addresses of a certain number of sectors of a nonvolatile memory, set the starting physical address of an arbitrary sector block among the sector blocks to the starting logical address of a data area, and set the data area of logical address down to the last sector of physical address.

The present invention is designed to form sector blocks each including physical addresses of a certain number of sectors of a nonvolatile memory, set the starting physical address of an arbitrary sector block among the sector blocks to the starting logical address of the data area, set the data area of logical address down to the last sector of physical address, and set the remaining data area to physical addresses by starting at the starting physical address.

The present invention is designed to form, for each of two nonvolatile memories, sector blocks each including physical addresses of a certain number of sectors, set the starting logical address of a data area to the starting physical address of an arbitrary sector block of one nonvolatile memory, set the remaining logical addresses to sector blocks of the two nonvolatile memories alternately on a block by block basis down to the last sectors of physical address of the two nonvolatile memories, and set the remaining data area to physical addresses of the one nonvolatile memory by starting at the starting physical address.

The present invention is designed to form, for each of nonvolatile memories of 2N in number, sector blocks each including physical addresses of a certain number of sectors, set the starting logical address of a data area to the starting physical address of an arbitrary sector block of one nonvolatile memory among the 2N nonvolatile memories, set the remaining logical addresses sequentially to sector blocks of the 2N nonvolatile memories on a block by block basis down to the last sectors of physical addresses of the 2N nonvolatile memories, and set the remaining data area to the one nonvolatile memory by starting at the starting physical address.

The present invention is designed to make the physical address of the sector block, to which the logical address is set, nearest to the starting address of the data area.

The present invention is designed to store data to be written, which is transferred from a host unit, on a memory card temporarily, read out control information from a block of a nonvolatile memory, erase the block, and store data to be written next, which is transferred from the host unit, on the memory card temporarily, while storing the data, which has been stored temporarily on the memory card, in the block-erased sectors of the nonvolatile memory.

The present invention is designed to include a first step of reading out control information from a sector block of a nonvolatile memory which firstly undergoes data writing and implementing the block erasure of the sector block, a second step of reading out control information from an arbitrary sector of the nonvolatile memory which secondly undergoes data writing, while storing data to be written, which has been stored temporarily on a memory card, into sectors of nonvolatile memory, and storing temporarily data to be written next on the memory card, and a third step, which takes place after control information is all read out of the sector block of the second-writing nonvolatile memory, of storing the data which has been stored temporarily on the memory card into sectors of the first-writing nonvolatile memory, while erasing the read-out sector block, and reading out control information from an arbitrary sector of the second-writing nonvolatile memory, with the second and third steps being repeated down to the nonvolatile memory of the 2N-th data writing.

Based on these schemes, for multiple nonvolatile memories, erasure, writing and data transfer from a host unit to the memory card can take place concurrently, whereby the data write time can be reduced significantly.

Consequently, the performance of memory card can be enhanced significantly.

BEST MODE FOR CARRYING OUT THE INVENTION

The present invention will be explained in detail with reference to the attached drawings. Throughout the drawings, items having identical functions will be referred to by a common symbol, and explanation thereof will not be repeated.

Figure 1:
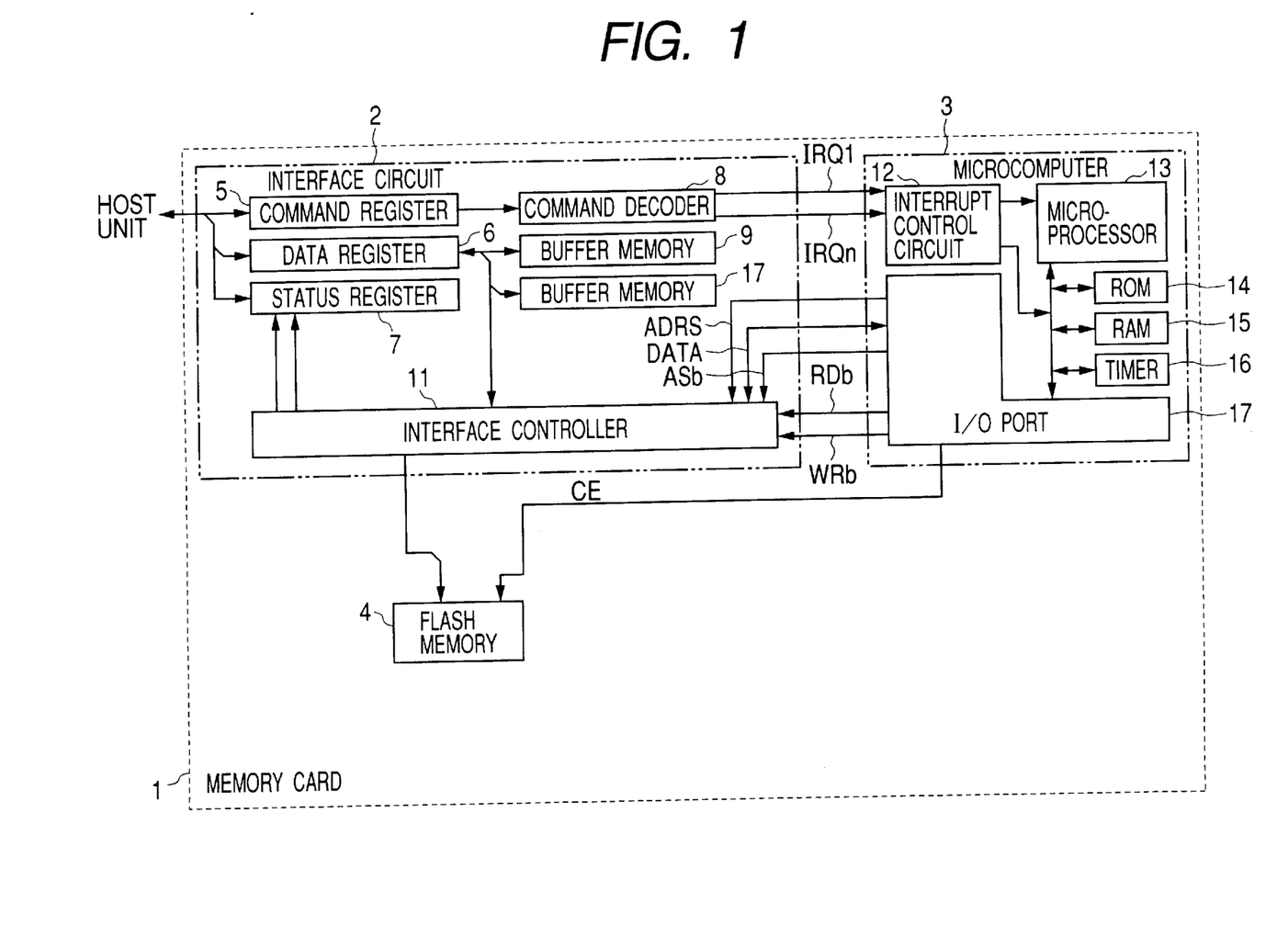
FIG. 1 is a block diagram of the memory card based on a first embodiment of this invention.

In the first embodiment of this invention, the memory card 1 is a flash memory card, which is used as external storage mediums of portable personal computers and multi-functional terminal units.

The memory card 1 is made up of an interface circuit 2, microcomputer 3 and flash memory (nonvolatile memory) 4, which are mounted on a printed circuit board. The interface circuit 2 and microcomputer 3 constitute a controller. The memory card 1 is put in and out of the PC card slot of a host unit such as a personal computer.

The interface circuit 2 includes a command register 5, data register 6, status register 7, command decoder 8, buffer memories 9 and 10, and interface controller 11.

The microcomputer 3 includes an interrupt control circuit 12, microprocessor (including an offset calculator) 13, ROM (Read Only Memory) 14, RAM (Random Access Memory) 15, timer 16, and input/output port 17.

The interface circuit 2 is linked through the PC card slot to the host unit, which gives a file operation command to the command register 5 and it is decoded by the command decoder 8.

The command decoder 8 releases interrupt signals IRQ1–IRQn depending on the decoding result. The interrupt control circuit 12 gives the interrupt signals IRQ1–IRQn to the microprocessor 13. The ROM 14 stores an operation program of the microprocessor 13, which runs the program by using the RAM 15 for the work area.

The microprocessor 13 controls the interface circuit 2 and flash memory 4 through the input/output port 17 in accordance with the operation program. The microcomputer 3 releases the address signal ADRS, address strobe signal ASb, read signal RDb and write signal WRb to the interface controller 11 to transact data (DATA) with it.

The microcomputer 3 makes access to the data register 6, status register 7 and buffer memories 9 and 10 through the interface controller 11.

The flash memory 4 shares the control signal lines and data signal lines which are connected to the interface controller 11. The microcomputer 3 releases the chip enable signals CE of individual chips of flash memory 4 from the input/output port 17.

Based on this arrangement, the microcomputer 3 selects a chip of flash memory 4, releases an address signal ADRS, address strobe signal ASb, read signal RDb and write signal WRb to the interface controller 11, thereby making access to the selected chip of flash memory 4 by way of the interface controller 11.

Figure 2:
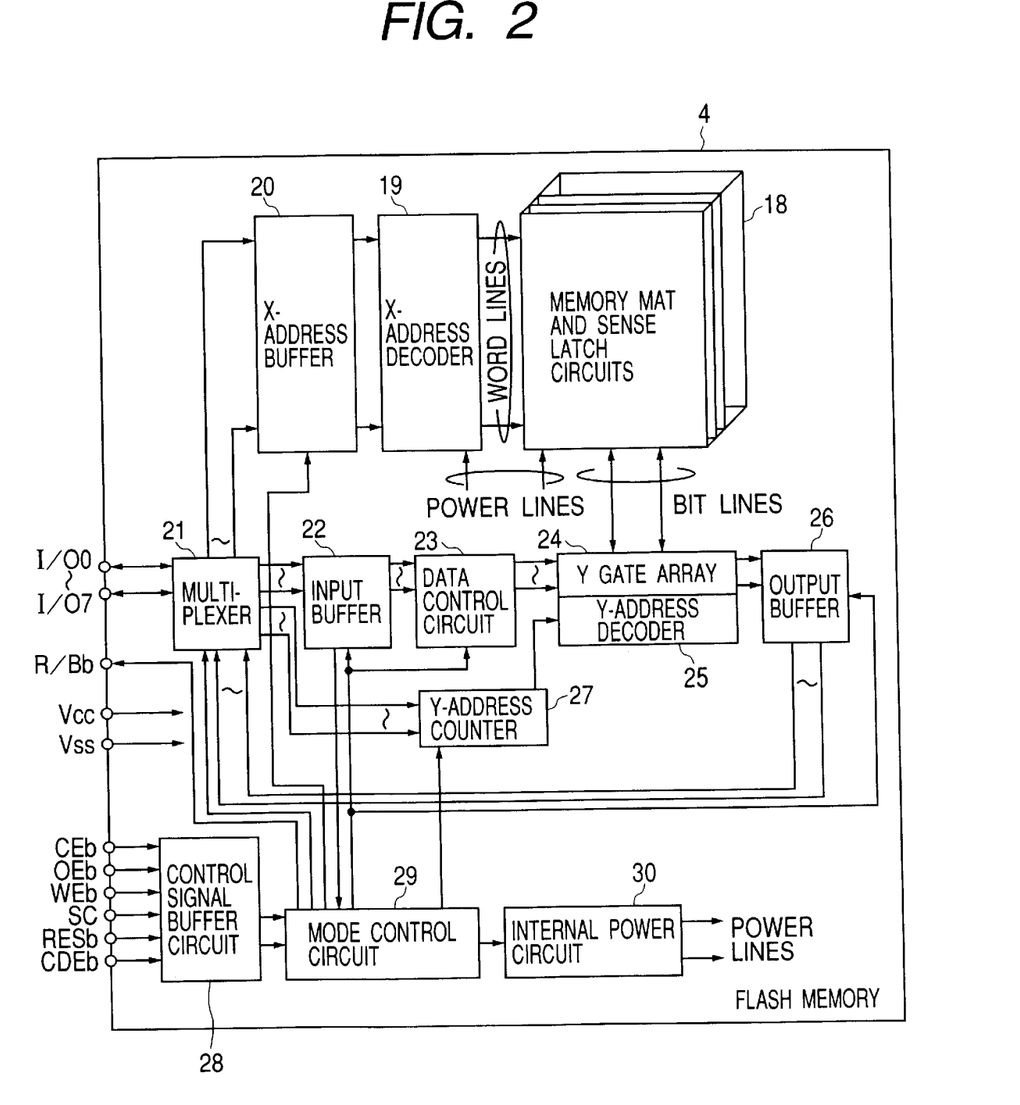
FIG. 2 is a block diagram of the flash memory included in the memory card of the first embodiment of this invention.

The flash memory 4 will be explained with reference to FIG. 2.

The flash memory 4 includes a memory array 18, x-address decoder 19, x-address buffer 20, multiplexer 21, input buffer 22, data control circuit 23, y gate array 24, y-address decoder 25, output buffer 26, y-address counter 27, control signal buffer circuit 28, mode control circuit 29, and internal power circuit 30.

The memory array 18 includes a memory mat and sense-latch circuit. The memory mat has numerous memory cells of transistors which are nonvolatile and electrically erasable and rewritable.

Figure 11:
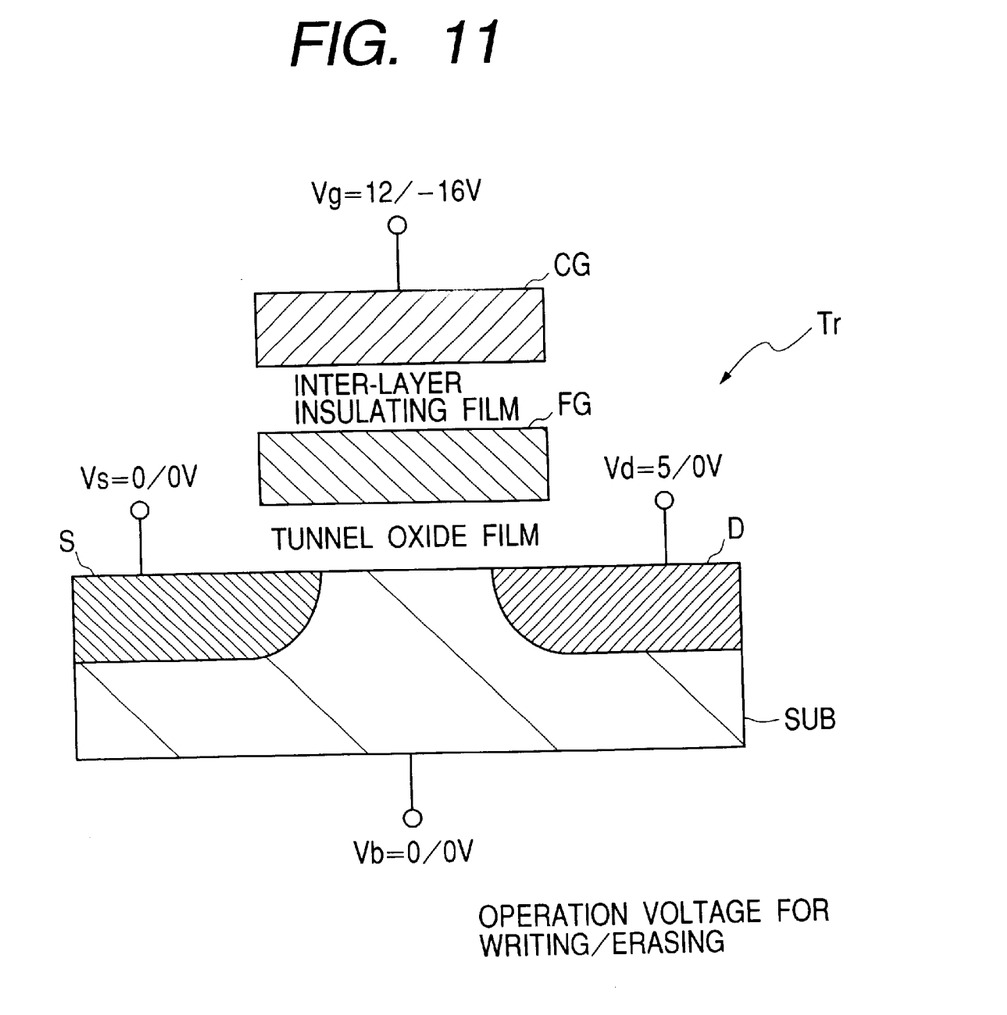
FIG. 11 is a cross-sectional diagram of a memory cell transistor included in the memory card based on the first embodiment of this invention.

As shown in FIG. 11, each memory cell transistor Tr of the memory array 18 has a source S and drain D which are formed in the semiconductor substrate or memory well SUB, a floating gate FG which is formed in the channel region by being interposed by a tunnel oxide film, and a control gate CG which is formed on the floating gate FG by being interposed by an inter-layer insulating film. The control gate CG is connected to a word line (shown in FIG. 2), and the drain D is connected to a bit line (shown in FIG. 2).

Input/output terminals I/O0–I/O7 are used commonly for the address input terminals, data input terminals and command input terminals. The x-address signal received on the input/output terminals I/O0–I/O7 is put in the x-address buffer 20 via the multiplexer 21. The x-address buffer 20 releases internal complementary address signals, which are decoded by the x-address decoder to drive the word lines.

The y-address decoder 25 releases a select signal, based on which the y gate array 24 selects bit lines. The y-address signal received on the input/output terminals I/O0–I/O7 is preset to the y-address counter 27, which increments the contents and puts the resulting y-address signal in the y-address decoder 25.

The bit lines selected by the y gate array 24 are made conductive to the input section of the output buffer 26 during the data output operation, or made conductive to the output terminals of the input buffer 22 via the data control circuit 23 during the data input operation.

The connection of the output buffer 26 and input buffer 22 with the input/output terminals I/O0–I/O7 is controlled by the multiplexer 21. Command signals received on the input/output terminals I/O0–I/O7 are put in the mode control circuit 29 via the multiplexer 21 and input buffer 22.

The data control circuit 23 provides the memory array 18 with data of logic values which are in accordance with the control of mode control circuit 29, besides the data received on the input/output terminals I/O0–I/O7.

The control signal buffer circuit 28 receives external access control signals, which include a chip enable signal CEb, output enable signal OEb, write enable signal WEb, serial clock signal SC, reset signal RESb, and command enable signal CDEb.

The mode control circuit 29 controls the flash memory interface function in accordance with these control signals and also controls the internal operation of the flash memory 4 in accordance with the command.

The internal power circuit 30 produces various power voltages used for memory writing, erase-verification and reading, and supplies these power voltages to the x-address decoder 19 and memory cell arrays of the memory mats 18.

Next, the logical address set to the flash memory 4 on the memory card 1 will be explained with reference to FIG. 3 and FIG. 4.

Figure 3:
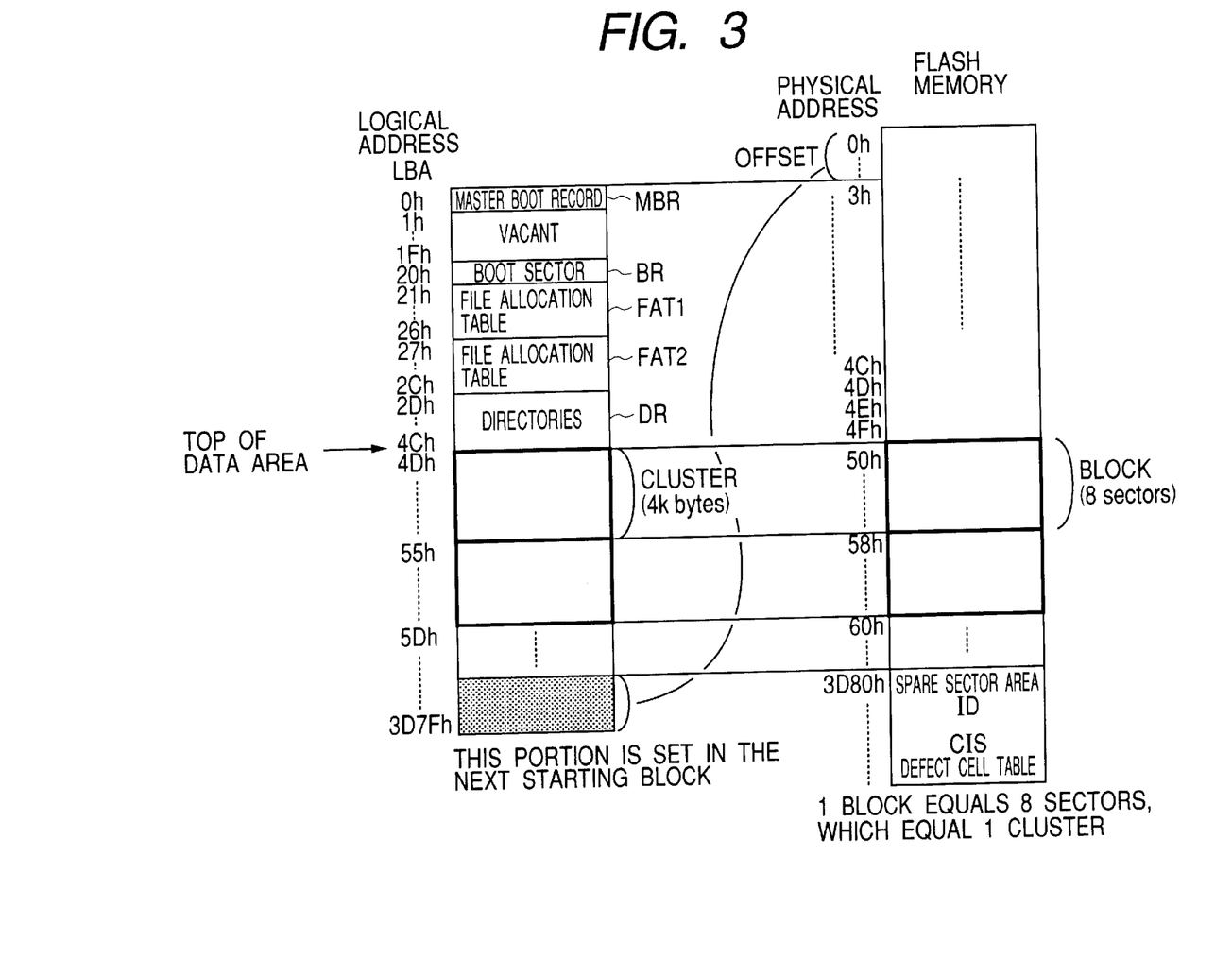
FIG. 3 is a diagram explaining the logical address of the memory card and the physical address which is fixed to the flash memory based on the first embodiment of this invention.

The logical addresses shown on the left side of FIG. 3 have their leading section assigned to a system area for storing control data of the flash memory 4.

The system area contains master boot record MBR, boot sector BS, file allocation tables FAT1 and FAT2, and directories DR. The system area has the allotment of logical addresses ranging 0h–4Ch (suffix "h" signifies hexadecimal).

The system area is followed by a data area which ranges 4Dh–3D7Fh in terms of logical address for storing data transacted with the host unit. The data area is partitioned into sectors. The sector is a unit area for data reading, writing and erasing. One sector consists of a user data area having a data length of 512 bytes and a control information area having a data length of 16 bytes.

The allotment of logical address to the system area and data area is done at the time of formatting, which is based on MS-DOS (Microsoft Disk Operating System: registered trademark of Microsoft Corporation, USA) before the shipment of the memory card 1.

The physical addresses which are fixed to the flash memory 4 prior to the MS-DOS formatting as shown on the right side of FIG. 3 will be explained.

In this flash memory 4, physical addresses 0h–3D7F are used for the setting of logical addresses, and the remaining area starting at 3D80h is used for a defect table area for storing a defective sector table, a spare sector area for making access to a spare sector with reference to the defective sector table, an ID area for storing the memory card drive information ID (Identify Drive Information), and a CIS area for storing the memory card information CIS (Card Information Structure) including the name, type and function of memory card. The defective sector table area, ID area and CIS area cannot be accessed by the user.

The setting of logical addresses to physical addresses for the flash memory 4 will be explained.

The physical addresses are partitioned from the starting address sequentially into blocks (a block has 8 sectors, which have 4 k bytes). The data area starts at logical address 4Dh.

This address corresponds most closely to the block starting address of physical address 50h, and clusters of data area are set to blocks by making the data area starting address 4Dh correspondent to the block starting address 50h.

Accordingly, logical address 0h is set by being offset to physical address 3h, and data in a unit of cluster (4 k bytes or 2 k bytes) sent from the host unit match with blocks.

The offset value is stored in advance in an area, e.g., ID area, of the flash memory 4, and it is read out by the microprocessor 13 and loaded into the RAM 15 when power is turned on.

The logical address value used by the host unit is converted into the physical address value based on the calculation by the microprocessor 13 by use of the offset value stored in the RAM 15.

Due to the offset between the physical address and logical address, the last three logical addresses 3D7Dh–Dh7Fh are brought back to the top of physical address and set to physical addresses 0h–2h.

Figure 4:
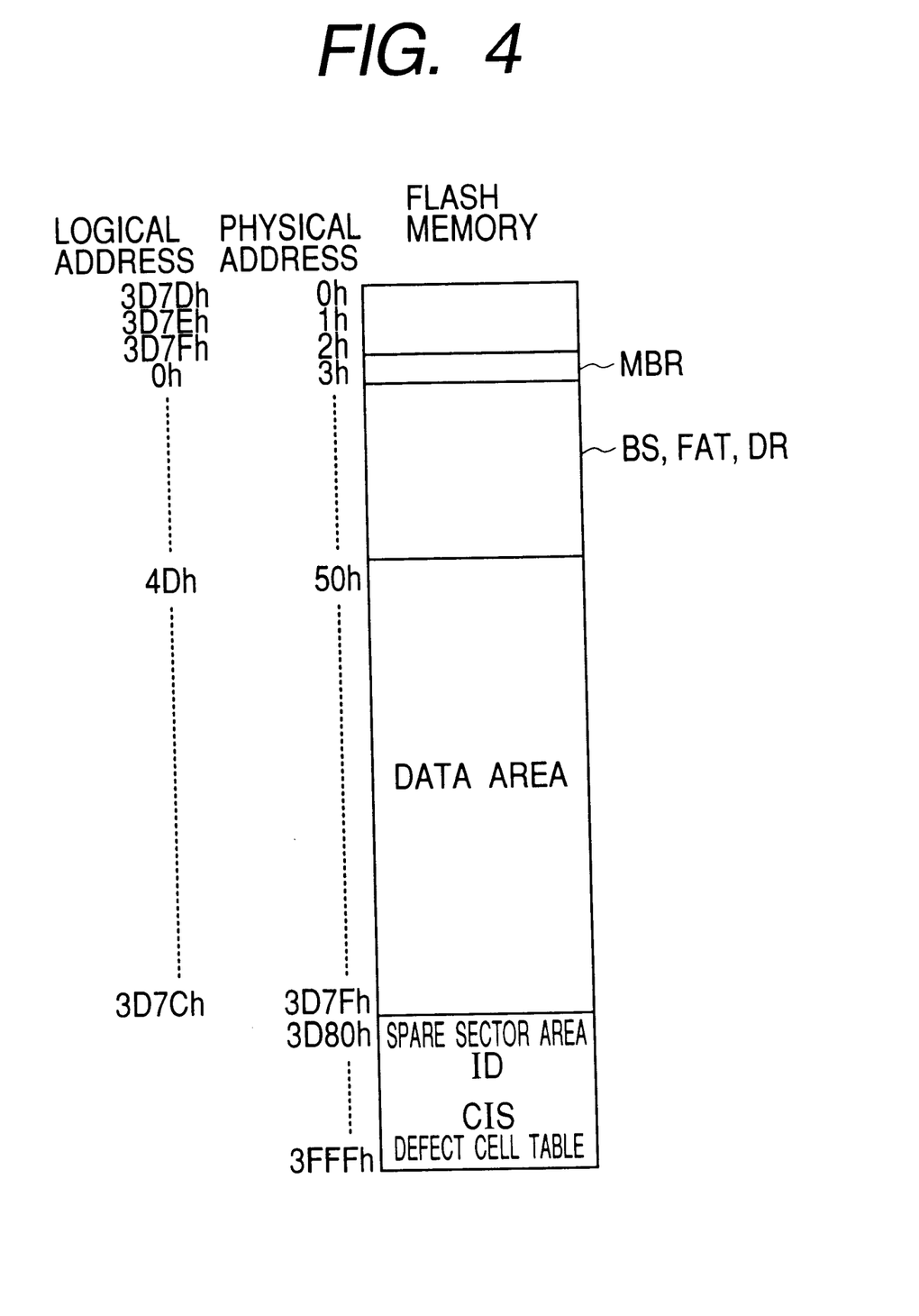
FIG. 4 is a diagram explaining the flash memory address, with the logical address being set thereto, based on the first embodiment of this invention.

FIG. 4 shows the result of setting of the logical addresses, with the offset being put thereon, to the physical addresses of the flash memory 4.

The data area which starts at logical address 4Dh is set to the physical addresses by starting at address 50h which is the starting address of a block, with the last logical addresses 3D7Dh–Dh7Fh being brought back to the top of physical address and set to addresses 0h–2h.

Next, data erasure of the flash memory 4 which has been rendered the logical address setting will be explained.

For example, when data of 16 sectors (2 clusters) starting at logical address 4Dh is written, 16 sectors of logical addresses starting at 4Dh, i.e., 2 blocks of logical addresses 50h–60h, is erased, and accordingly the erasing operation takes place twice.

Figure 5:
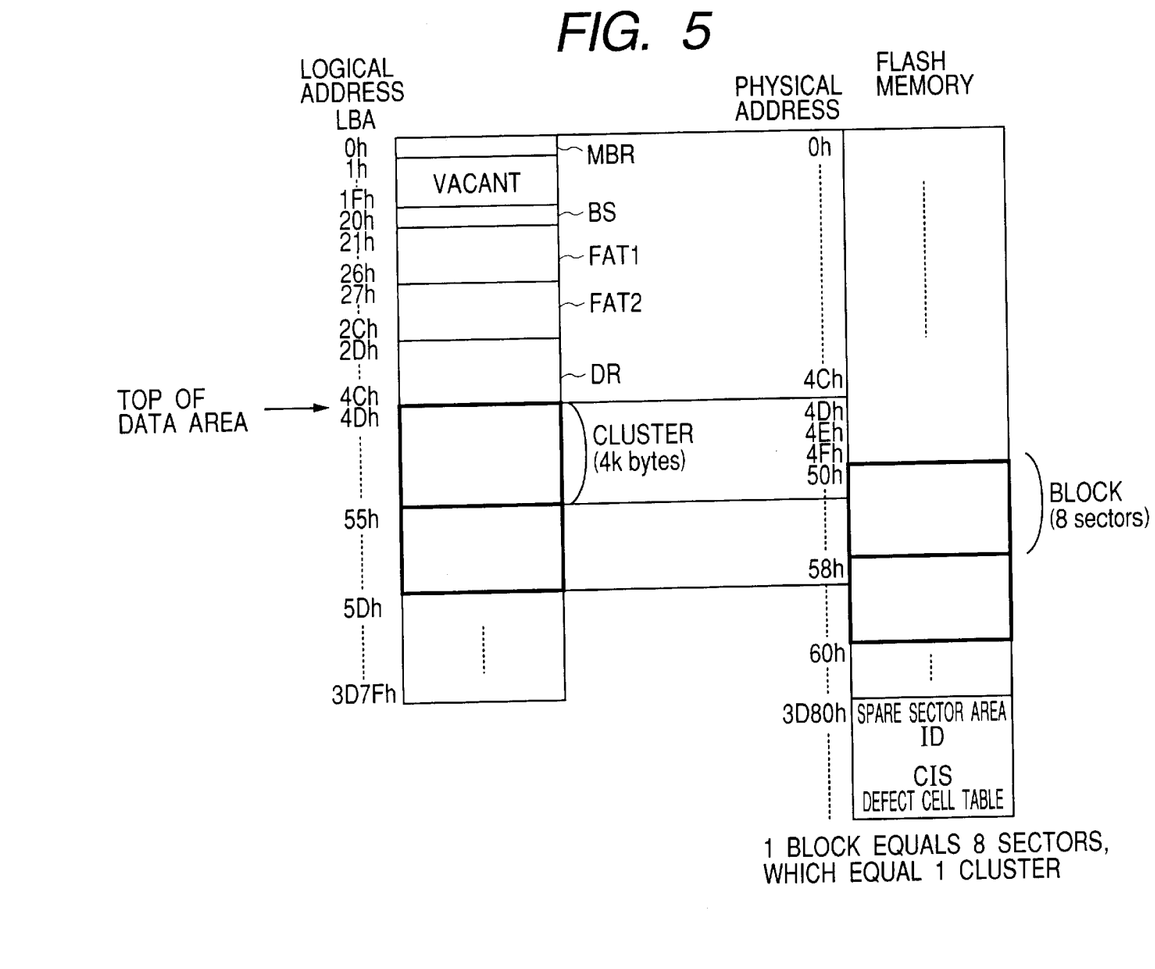
FIG. 5 is a diagram explaining the flash memory address, with the logical address being set thereto, resulting from the study conducted by the inventors of the present invention.

FIG. 5 shows the logical address setting scheme examined by the inventors of the present invention, in which logical addresses are set directly to physical addresses.

The data area starts at logical address 4Dh, and it also starts at physical address 4Dh. The physical addresses are partitioned from the starting address 0h sequentially into blocks (a block has 8 sectors, which have 4 k bytes) as in the case of the first embodiment. In this case, however, the physical address 4Dh is an intermediate address of a block and therefore the cluster and block do not match in their starting addresses.

When data of 16 sectors starting at logical address 4Dh is written, 16 sectors of logical addresses 4Dh–5Dh need to be erased.

In this case, block erasure takes place only for the block of physical addresses 50h–57h, and the remaining block of 8 sectors needs to be erased by sector erasure. The resulting 9 erasing operations increase the data erase time significantly.

Figure 6:
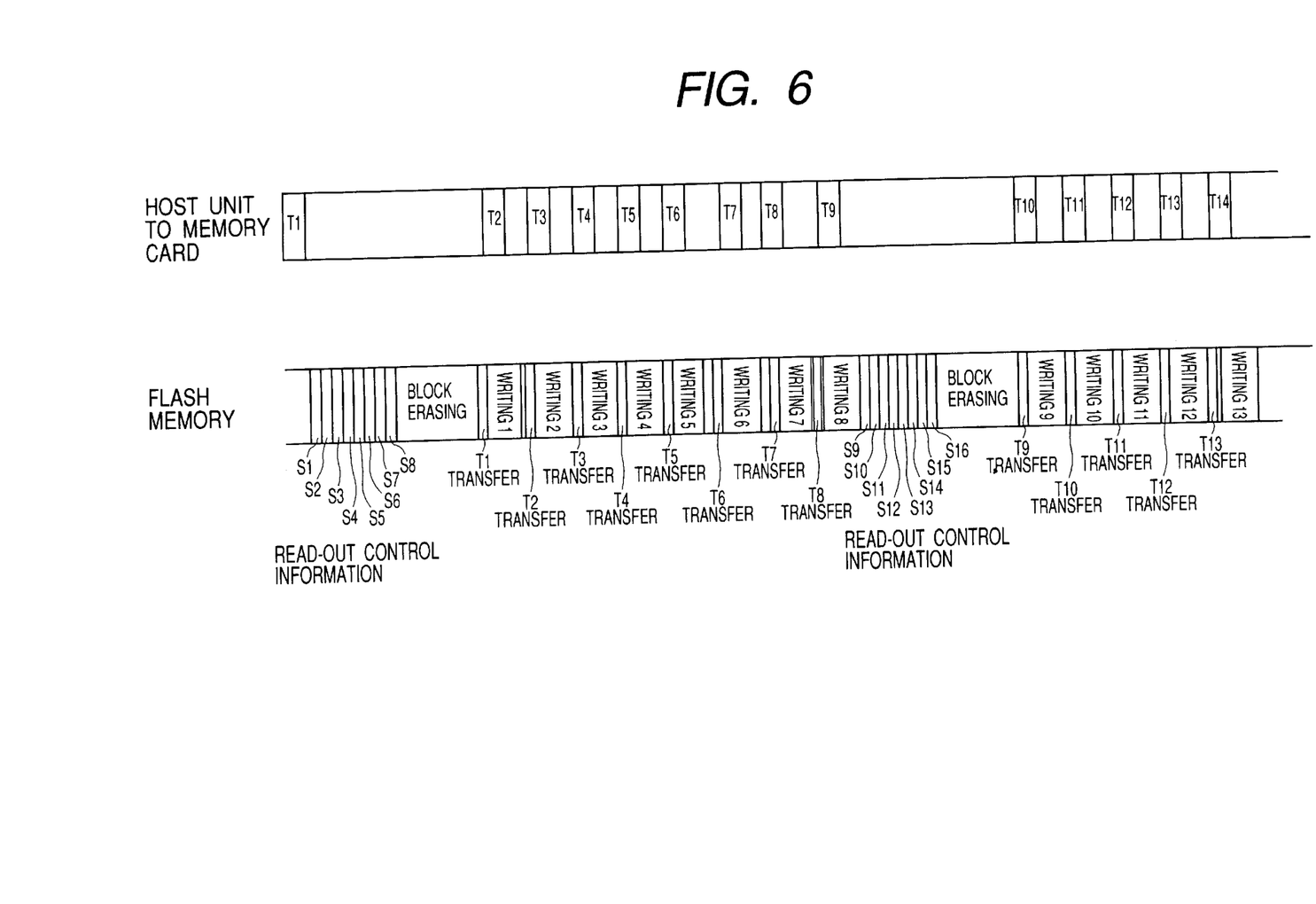
FIG. 6 is a timing chart of data writing on the memory card based on the first embodiment of this invention.

Next, the data write operation of the flash memory 4 will be explained with reference to the timing chart of FIG. 6.

The host unit transfers data T1 of one sector to the buffer memory of the memory card 1. The controller of the memory card 1 reads out control information of the sectors S1–S8 of the flash memory 4 to be written and, on detecting their normality, implements block erasure to erase all data of the sectors S1–S8 at once.

The transferred data T1 is loaded into the input buffer of the flash memory 4, and data writing (writing 1) takes place. During the write operation, the host unit transfers data T2 to be written next.

After the data T1 has been written, the next data T2 is loaded into the input buffer of the flash memory 4, and data writing (writing 2) takes place. During the write operation, the host unit transfers data T3 to be written next.

In this manner, data writing to the flash memory 4 and data transfer to the memory card 1 are carried out concurrently, while implementing block erasure of data, thereby writing data to the flash memory 4 efficiently.

According to the first embodiment of this invention, the logical address is set to the physical address of the flash memory 4 by being offset so that the block areas and cluster areas match, allowing block erasure of data of the flash memory 4, whereby the number of erasing operations at data writing can be reduced significantly.

Moreover, data writing to the flash memory 4 and data reception from the host unit are carried out concurrently, whereby the data write time can be reduced significantly.

Figure 7:
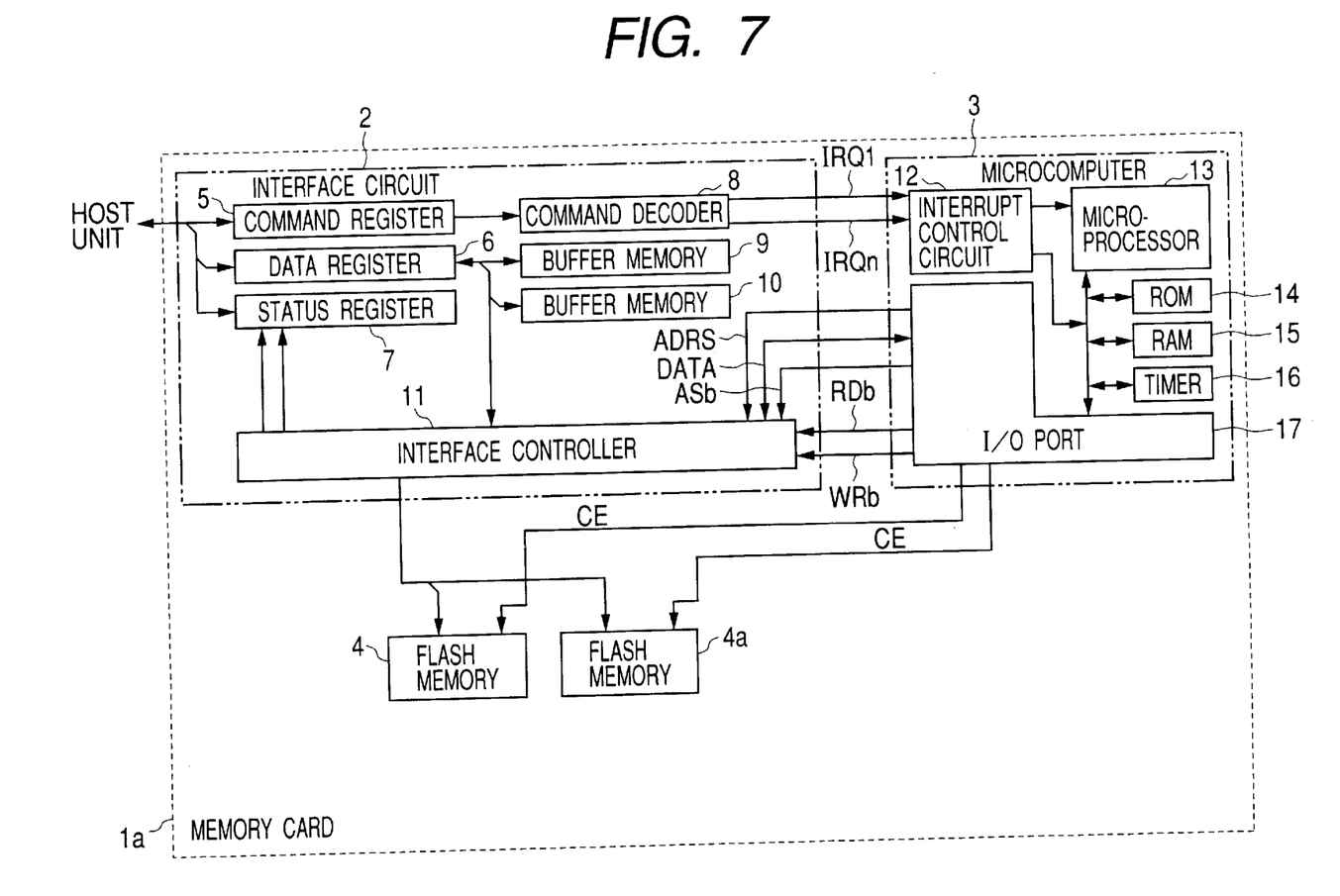
FIG. 7 is a block diagram of the memory card based on a second embodiment of this invention.

Next, the structure of the memory card 1a based on the second embodiment will be explained. As shown in FIG. 7, the memory card 1a is made up of an interface circuit 2, microcomputer 3 and flash memories 4 and 4a. Namely, this memory card 1a has the additional provision of the flash memory 4a, besides the interface circuit 2, microcomputer 3 and flash memory 4 which are identical to those of the preceding first embodiment.

Specifically, the interface circuit 2 includes a command register 5, data register 6, status register 7, command decoder 8, buffer memories 9 and 10, and interface controller 11, and the microcomputer 3 includes an interrupt control circuit 12, microprocessor 13, ROM 14, RAM 15, timer 16, and input/output port 17 as in the case of the preceding first embodiment.

The flash memories 4 and 4a (nonvolatile memories) share the control signal lines and data signal lines which are connected to the interface controller 11. The microcomputer 3 releases the chip enable signals CE of the flash memories 4 and 4a from the input/output port 17.

Based on this arrangement, the microcomputer 3 selects chips of flash memories 4 and 4a, releases the address signal ADRS, address strobe signal ASb, read signal RDb and write signal WRb to the interface controller 11, thereby making access to the selected chips of flash memories 4 and 4a by way of the interface controller 11.

The flash memory 4a is identical in arrangement to the flash memory 4 (shown in FIG. 2), and includes a memory array 18, x-address decoder 19, x-address buffer 20, multiplexer 21, input buffer 22, data control circuit 23, y gate array 24, y-address decoder 25, output buffer 26, y-address counter 27, control signal buffer circuit 28, mode control circuit 29, and internal power circuit 30.

Next, the logical address set to the flash memories 4 and 4a of the memory card 1a will be explained with reference to FIG. 8.

Figure 8:
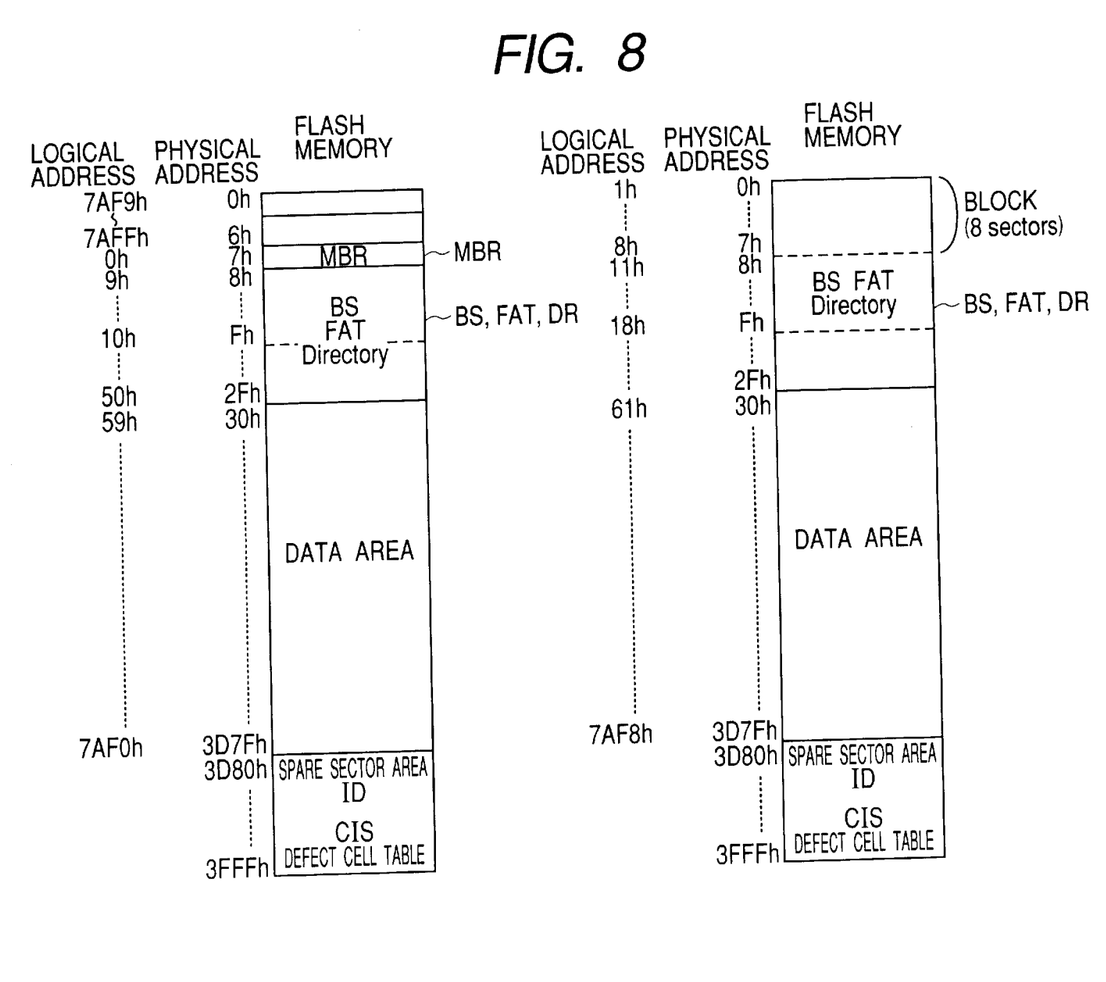
FIG. 8 is a diagram explaining the address of memory card, with the logical address being set thereto, based on the second embodiment of this invention.

FIG. 8 shows on the left side the data structure of the flash memory 4, with the logical address being set, and shows on the right side the data structure of the flash memory 4a, with the logical address being set.

The logical addresses have their leading section assigned to a system area for storing control data of the flash memory 4. The system area contains master boot record MBR, boot sector BS, file allocation table FAT, and directories DR as in the case of the preceding first embodiment.

The system area has the setting of logical addresses ranging 0h–58h, and it is followed by a data area having the setting of logical addresses ranging 59h–7AFFh for storing data transacted with the host unit. The setting of logical address to the system area and data area is done at the time of MS-DOS formatting before the shipment of the memory card 1 as in the case of the preceding first embodiment.

The physical addresses which are fixed to the flash memories 4 and 4a will be explained.

For the flash memories 4 and 4a, physical addresses 0h–3D7Fh are used for the setting of logical addresses, and the remaining area starting at 3D80h is used for a defect table area for storing a defective sector table, a spare sector area for making access to a spare sector with reference to the defective sector table, an ID area for storing the memory card drive information ID, and a CIS area for storing the memory card information CIS (Card Information Structure) including the name, type and function of memory card. The defective sector table area, ID area and CIS area cannot be accessed by the user.

The setting of logical addresses to physical addresses of the flash memories 4 and 4a will be explained.

The physical addresses of the flash memories 4 and 4a are partitioned from the starting address sequentially into blocks (a block has 8 sectors, which have 4 k bytes). The data area of the flash memory 4 starts at logical address 59h as mentioned previously.

This address corresponds most closely to the block starting address at physical address 30h, and the blocks starting at address 30h are assigned to the data area so that the data area starting address 59h corresponds to the block starting address 30h.

After the blocks of flash memory 4 starting at address 30h have been assigned to the data area, the blocks of flash memory 4a starting at address 30h are assigned to the data area.

Figure 9:
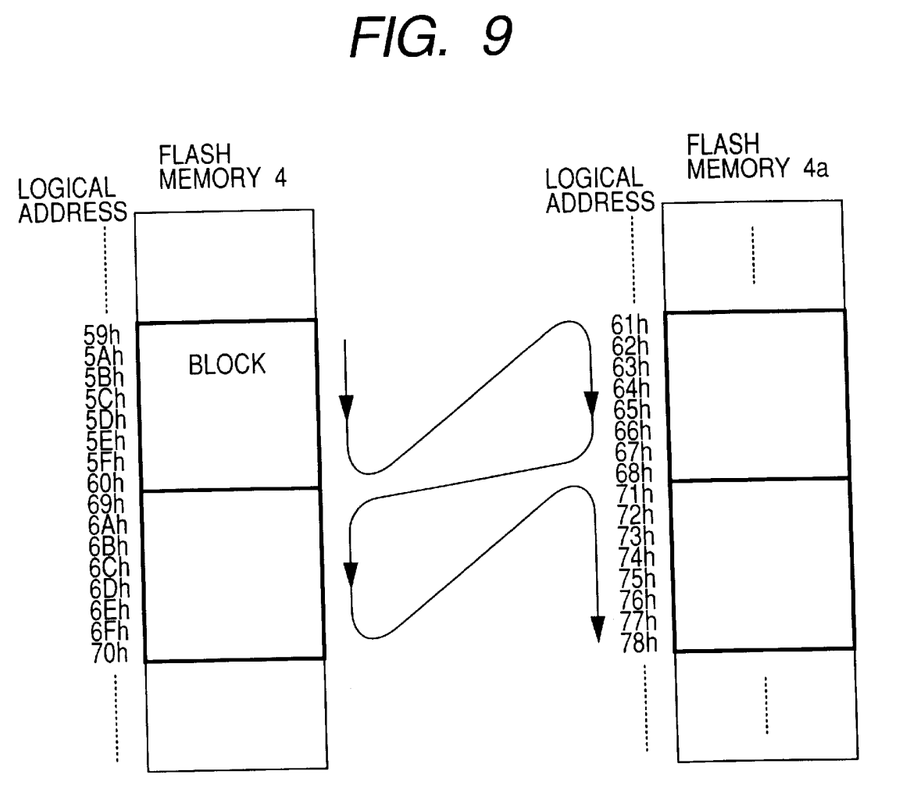
FIG. 9 is a diagram explaining the logical address which is set to the physical address based on the second embodiment of this invention.

The data areas of the flash memories 4 and 4a are set alternately on a block by block basis. For example, as shown in FIG. 9, after logical addresses 59h–60h have been set to the flash memory 4, the successive logical addresses 61h–68h are set to the flash memory 4a.

Due to the offset between the physical address and logical address, the last seven logical addresses 7AF0h–7AFFh are brought back to the top of physical address and set to physical addresses 0h–6h.

Accordingly, the logical addresses 7AF0h–7AFFh are set by being offset to the physical addresses 0h–6h for the flash memory 4.

Logical address setting for the system area will be explained. The system area also has its logical addresses set in a unit of block of physical address.

Since the physical address of the flash memory 4 has an offset of 7 sectors as mentioned previously, the block of addresses 0h–7h is assigned to the data area of addresses 0h–6h, and a system area of one sector is set to this block.

Accordingly, the master boot record MBR is set to physical address 7h of the flash memory 4, and the successive boot sector BS, file allocation table FAT, and directories DR are set alternately on a block by block (8 sectors) basis to the flash memories 4 and 4*a*.

Data erasing of the flash memories 4 and 4*a* will be explained.

When data of 16 sectors (2 clusters) starting at logical address 59h is written, 16 sectors starting at logical address 59h, i.e., a block of physical addresses 30h–37h of the flash memory 4 and another block of physical addresses 30h–37h of the flash memory 4*a*, are erased by carrying out the erasing operation twice.

Figure 10:
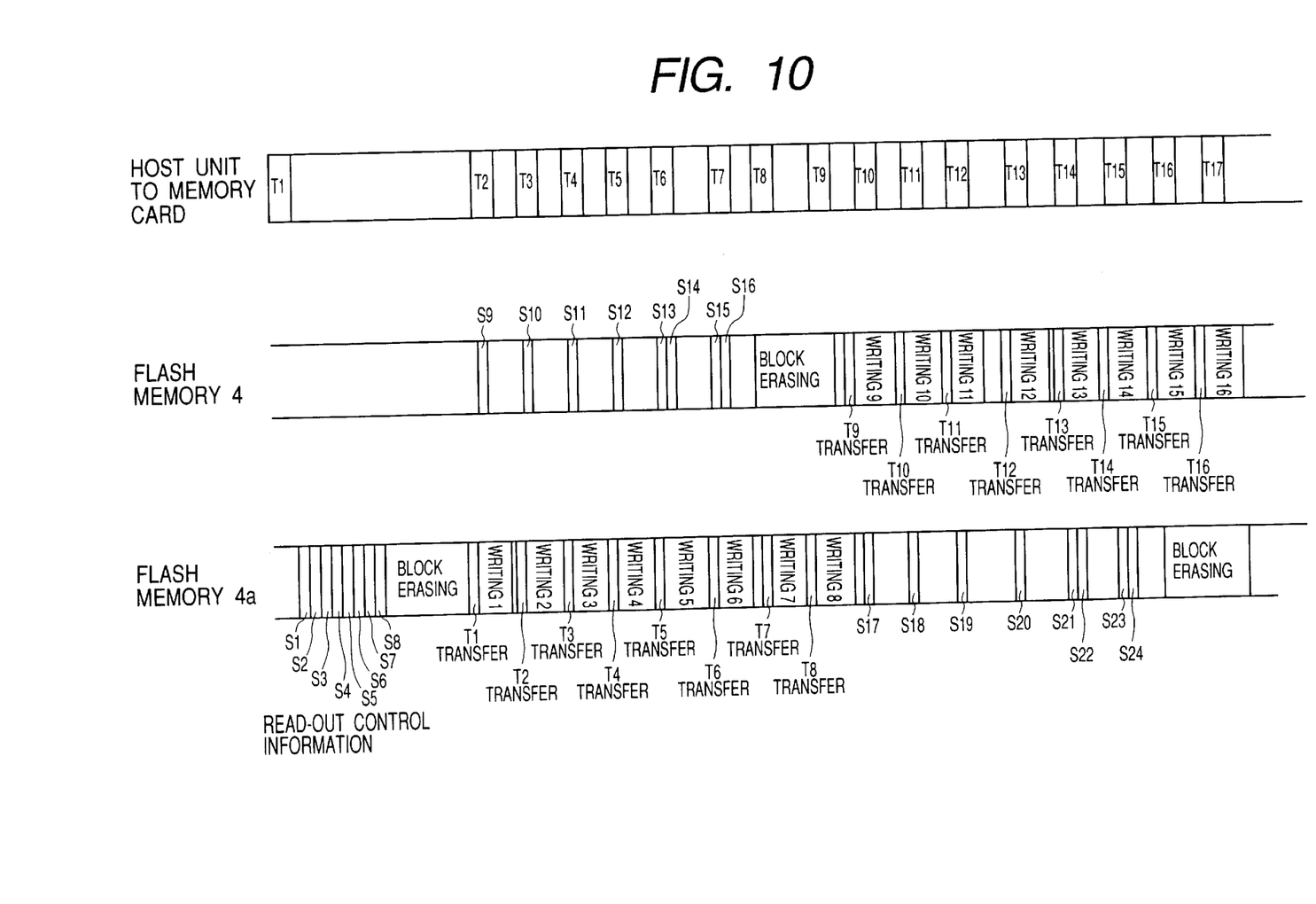
FIG. 10 is a timing chart of data writing on the memory card based on the second embodiment of this invention.

The data write operation of the flash memories 4 and 4*a* will be explained with reference to the timing chart of FIG. 10.

The host unit transfers data T1 of one sector to the buffer memory of the memory card 1. The controller of the memory card 1 reads out control information of the sectors S1–S8 of the flash memory 4*a* to be written and, on detecting their normality, implements block erasure to erase all data of the sectors S1–S8 at once.

The transferred data T1 is loaded into the input buffer of the flash memory 4*a*, and data writing (writing 1) takes place. During the write operation, the host unit transfers data T2 to be written next. During the transfer of data T2, the controller of the memory card 1 reads control information out of the sector S9 of the flash memory 4.

After the data T1 has been written, the next data T2 is loaded into the input buffer of the flash memory 4, and data writing (writing 2) takes place. During the write operation, the host unit transfers data T3 to be written next. During the transfer of data T3, the controller of the memory card 1 reads control information out of the sector S10 of the flash memory 4.

These operations are repeated to load transferred data T5 into the input buffer of the flash memory 4 and written (writing 5), and the host unit transfers data T6 to be written next. During the transfer of data T6, the controller of the memory card 1 reads control information out of the sectors S13 and S14 of the flash memory 4.

The transferred data T6 is loaded into the input buffer of the flash memory 4, and data writing (writing 6) takes place. During the transfer of data T7 to be written next from the host unit, the controller of the memory card 1 reads out control information of the sector S15 and S16 of the flash memory 4. Control information of the sectors S9–S16 for one block of the flash memory 4 is now read.

The transferred data T7 is loaded into the input buffer of the flash memory 4 and written (writing 7), and during the transfer of data T8 to be written next from the host unit, block erasure of data of the eight sectors of the flash memory 4 takes place.

These operates are repeated to carry out the erasure and writing of the two flash memories 4 and 4*a* and the data transfer to the memory card 1 concurrently.

According to the second embodiment, data writing and block erasure of the flash memories 4 and 4*a* of the memory card 1 can take place during the data transfer from the host unit, whereby the data write time can be reduced significantly.

Although the second embodiment is the case of using two flash memories, it is also possible for other cases of flash memories of 2*n* in number, which is more than four, to reduce the data write time significantly.

Although the specific embodiments of the present invention have been explained, the present invention is not confined to these embodiments, but various alterations are obviously possible without departing from the essence of the invention.

Industrial Applicability

The inventive memory card, method of logical address allotment and method of data writing are useful for the speed-up of data erasure and writing on the memory card.

What is claimed is:

1. A memory card comprising an offset storage section which stores an offset value, and an offset calculation section which implements a computation for the offset value in said offset storage section and input logical addresses, wherein said logical addresses are rendered the offset based on the computation of said offset calculation section and set to physical addresses of a nonvolatile memory so that a unit of cluster and a unit of block match with each other.

2. A memory card according to claim 1, wherein said offset storage section is included in an area of said nonvolatile memory.

3. A memory card according to claim 2, wherein said offset value is stored in an area of said nonvolatile memory, said area being inaccessible by users.

4. A method of logical address allotment comprising the steps of: forming sector blocks each including a certain number of sectors of physical addresses of a nonvolatile memory; setting the starting physical address, with a certain offset being put thereon, to the starting logical address so that the starting physical address of an arbitrary sector block among said sector blocks is set to the starting logical address of a data area; and setting the data area of logical address down to the last sector of physical address.

5. A method of logical address allotment comprising the steps of: forming sector blocks each including a certain number of sectors of physical addresses of a nonvolatile memory which has a first section of physical addresses and a second section of physical addresses which are continuous to the physical addresses of the first section; setting the starting physical address, with a certain offset being put thereon, to the starting logical address so that the starting physical address of an arbitrary sector block among said sector blocks is set to the starting logical address of a data area; setting logical addresses of the data area down to the last sector of the first section; and setting the remaining data area to physical addresses by starting at the starting physical address.

6. A method of logical address allotment according to claim 5, wherein the physical address of said sector block, to which said logical address is set, is nearest to the starting logical address of said data area.

7. A method of logical address allotment for two nonvolatile memories each having a first section of physical addresses and a second section of physical addresses which are continuous to the physical addresses of the first section, said method comprising the steps of: forming, for each of said nonvolatile memories, sector blocks each including a certain number of sectors of physical addresses of nonvolatile memory; setting the starting physical address, with a certain offset being put thereon, of one nonvolatile memory among said two nonvolatile memories to the starting logical address so that the starting logical address of a data area is set to the starting physical address of an arbitrary sector block of said one nonvolatile memory; setting the remaining logical addresses alternately on a block by block basis to the sector blocks of said two nonvolatile memories down to the last sectors of the first section of physical addresses of said two nonvolatile memories; and setting the remaining data area to physical addresses of said one nonvolatile memory by starting at the starting physical address.

8. A method of logical address allotment according to claim 7, wherein the physical address of said sector block, to which said logical address is set, is nearest to the starting logical address of said data area.

9. A method of logical address allotment for nonvolatile memories of 2N in number each having a first section of physical addresses and a second section of physical addresses which are continuous to the physical addresses of the first section, said method comprising the steps of: forming, for each of said 2N nonvolatile memories, sector blocks each including a certain number of sectors of physical addresses of nonvolatile memory; setting the starting physical address, with a certain offset being put thereon, of one nonvolatile memory among said 2N nonvolatile memories to the starting logical address so that the starting logical address of a data area is set to the starting physical address of an arbitrary sector block of said one nonvolatile memory; setting the remaining logical addresses sequentially on a block by block basis to the sector blocks of said 2N nonvolatile memories down to the last sectors of physical addresses of said 2N nonvolatile memories; and setting the remaining data area to physical addresses of said one nonvolatile memory by starting at the starting physical address.

10. A method of logical address allotment according to claim 9, wherein the physical address of said sector block, to which said logical address is set, is nearest to the starting logical address of said data area.

11. A method of data writing on a memory card which has a nonvolatile memory having a first section of physical addresses and a second section of physical addresses which are continuous to the physical addresses of the first section, said method comprising the steps of: setting the starting physical address, with a certain offset being put thereon, to the starting logical address; storing temporarily data to be written, which is transferred from a host unit, on said memory card; reading out control information from a block of said nonvolatile memory and erasing the block; and storing temporarily data to be written next, which is transferred from the host unit, on said memory card, while storing the data which has been stored temporarily on said memory card into the block-erased sectors of said nonvolatile memory.

12. A method of data writing on a memory card which has nonvolatile memories of 2N in number each having a first section of physical addresses and a second section of physical addresses which are continuous to the physical addresses of the first section, said method comprising: a first step of setting the starting physical address, with a certain offset being put thereon, to the starting logical address, reading out control information from a sector block of a nonvolatile memory which firstly undergoes data writing, and implementing block erasure of the sector block; a second step of reading out control information from an arbitrary sector of a nonvolatile memory which secondarily undergoes data writing, while storing data which has been stored temporarily on said memory card into sectors of said nonvolatile memory, and storing temporarily on said memory card data to be written next; and a third step, which takes place after all control information has been read out of the sector block of said secondly writing nonvolatile memory, of storing the rest of data which has been stored temporarily on said memory card into sectors of said firstly writing nonvolatile memory successively, while erasing the sector block, said second and third steps being repeated down to the nonvolatile memory of the 2N-th data writing.

* * * * *